(12) United States Patent
Luo

(10) Patent No.: US 10,693,463 B2
(45) Date of Patent: Jun. 23, 2020

(54) LINE DRIVER APPARATUS WITH COMBINED FEED-THROUGH CAPACITANCE AND FEED-FORWARD EQUALIZATION

(71) Applicant: Lattice Semiconductor Corporation, Portland, OR (US)

(72) Inventor: Kexin Luo, Shanghai (CN)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 292 days.

(21) Appl. No.: 15/487,847

(22) Filed: Apr. 14, 2017

(65) Prior Publication Data

US 2017/0302267 A1    Oct. 19, 2017

Related U.S. Application Data

(60) Provisional application No. 62/323,129, filed on Apr. 15, 2016.

(30) Foreign Application Priority Data

Aug. 31, 2016    (CN) .......................... 2016 1 0797776

(51) Int. Cl.
| | |
|---|---|
| H03K 19/0175 | (2006.01) |
| H04L 25/08 | (2006.01) |
| H04L 25/03 | (2006.01) |
| H03F 3/45 | (2006.01) |

(52) U.S. Cl.
CPC . *H03K 19/017509* (2013.01); *H03F 3/45183* (2013.01); *H04L 25/03133* (2013.01); *H04L 25/03343* (2013.01); *H04L 25/085* (2013.01)

(58) Field of Classification Search
CPC ...... H03K 19/017509; H04L 25/03133; H04L 25/03343; H04L 25/085
See application file for complete search history.

(56) References Cited

U.S. PATENT DOCUMENTS

| | | | |
|---|---|---|---|
| 6,351,172 B1* | 2/2002 | Ouyang | ........... H03K 19/00384 |
| | | | 327/112 |
| 7,053,679 B2* | 5/2006 | Rho | ..................... G11C 7/1051 |
| | | | 326/83 |

(Continued)

*Primary Examiner* — Lincoln D Donovan
*Assistant Examiner* — Diana J. Cheng
(74) *Attorney, Agent, or Firm* — Haynes and Boone, LLP

(57) ABSTRACT

Example embodiments of the present disclosure relate to a line driver apparatus. In some example embodiments, an apparatus is provided. The apparatus includes a capacitive feed-through module and a driving module. The capacitive feed-through module includes a first pre-driver operable to receive input differential signals and delayed signals of the input differential signals, generate first drive signals from the input differential signals and the delayed signals, and equalize the first drive signals. The capacitive feed-through module also includes a capacitance reducing module arranged between the first pre-driver and transmission lines and operable to reduce parasitic capacitance at the transmission lines in response to the first drive signals. The driving module is coupled to the transmission lines and operable to generate output differential signals from the input differential signals for transmission on the transmission lines.

16 Claims, 8 Drawing Sheets

(56) References Cited

U.S. PATENT DOCUMENTS

| | | | | |
|---|---|---|---|---|
| 2003/0197696 A1* | 10/2003 | Onozawa | ............... | G09G 3/296 |
| | | | | 345/212 |
| 2004/0113656 A1* | 6/2004 | Sato | .................... | H04L 25/0278 |
| | | | | 326/86 |
| 2015/0222261 A1* | 8/2015 | Luo | ..................... | H04L 25/0272 |
| | | | | 327/109 |

* cited by examiner

LINE DRIVER APPARATUS WITH COMBINED FEED-THROUGH CAPACITANCE AND FEED-FORWARD EQUALIZATION

CROSS REFERENCE TO RELATED APPLICATIONS

The present application claims priority from U.S. Provisional Patent App. No. 62/323,129, filed on Apr. 15, 2016, and from Peoples' Republic of China App. No. CN201610797776.X, filed on Aug. 31, 2016, both of which are incorporated herein by reference in its entirety.

TECHNOLOGY

Embodiments of the present disclosure generally relate to a line driver apparatus, and more particularly, to a line driver apparatus with combined feed-through capacitance (FTC) and feed-forward equalization (FFE).

BACKGROUND

Generally, a line driver is employed in a transmitter of a communication system to drive data to be sent on transmission lines. In digital signal transmission, when the data rate is relatively high, a binary symbol cannot complete transition within a symbol interval, and its symbol energy will spread into the adjacent symbols. This undesirable spreading of symbol energy is defined as inter-symbol interference (ISI). The inter-symbol interference is mainly introduced by interconnections in the communication system, specifically, by signal attenuation and dispersion during propagation through the transmission lines. Such transmission lines may include a variety of media, such as cables like universal serial bus (USB) cables and high-definition multimedia interface (HDMI) cables, traces on a printed circuit board (PCB), package bonding wires, electro-static discharge (ESD) connections, and so on. It is therefore desired to counter-act the inter-symbol interference problem within the line driver before the signal is passed through the transmission lines.

SUMMARY

Example embodiments of the present disclosure propose a line driver apparatus for reducing inter-symbol interference.

In one aspect, example embodiments of the present disclosure provide an apparatus. The apparatus includes a capacitive feed-through module and a driving module. The capacitive feed-through module includes a first pre-driver operable to receive input differential signals and delayed signals of the input differential signals, generate first drive signals from the input differential signals and the delayed signals, and equalize the first drive signals. The capacitive feed-through module also includes a capacitance reducing module arranged between the first pre-driver and transmission lines and operable to reduce parasitic capacitance at the transmission lines in response to the first drive signals. The driving module is coupled to the transmission lines and operable to generate output differential signals from the input differential signals for transmission on the transmission lines.

In a second aspect, example embodiments of the present disclosure provide a method. The method includes generating, by a first pre-driver of an apparatus, first drive signals from input differential signals and delayed signals of the input differential signals and equalizing, by the first pre-driver, the first drive signals. The method also includes driving a capacitance reducing module of the circuit by the first drive signals to reduce parasitic capacitance at transmission lines, the transmission lines being coupled to the capacitance reducing module. The method further includes generating, by a driving module of the apparatus, output differential signals from the input differential signals for transmission on the transmission lines.

In a third aspect, example embodiments of the present disclosure provide an apparatus. The apparatus includes a first set of cascode transistors including gate terminals for receiving an input differential signal and a delayed signal of the input differential signal and an output terminal for outputting a first drive signal that is generated in response to the received input differential signal and the delayed signal and is equalized. The apparatus also includes a second set of cascode transistors including gate terminals for receiving an inverse signal of the input differential signal and an inverse delayed signal of the input differential signal and an output terminal for outputting a second drive signal that is generated in response to the received inverse signal and the inverse delayed signal and is equalized. The apparatus also includes a set of capacitors coupled to transmission lines and including input terminals coupled to the output terminals of the first and second sets of cascode transistors, the set of capacitors being operable to reduce parasitic capacitance on the transmission lines. The apparatus further includes a first differential pair of transistors including gate terminals for receiving third drive signals generated from the input differential signal and the inverse signal and drain terminals coupled to the transmission lines and for generating output differential signals that are generated in response to the received third drive signals.

Other advantages achieved by example embodiments of the present disclosure will become apparent through the following descriptions.

DESCRIPTION OF DRAWINGS

Through the following detailed description with reference to the accompanying drawings, the above and other objectives, features and advantages of example embodiments of the present disclosure will become more comprehensible. In the drawings, several example embodiments of the present disclosure will be illustrated in an example and non-limiting manner, wherein.

Throughout the drawings, the same or corresponding reference symbols refer to the same or corresponding parts.

DESCRIPTION OF EXAMPLE EMBODIMENTS

Figure 1:
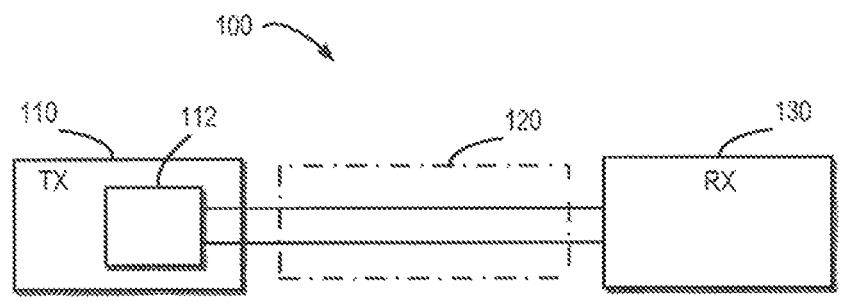
FIG. 1 illustrates an example environment where embodiments of the present disclosure can be implemented.

Principles of example embodiments of the present disclosure will now be described with reference to various example embodiments illustrated in the drawings. It should be appreciated that depiction of those embodiments is only to enable those skilled in the art to better understand and further implement example embodiments of the present disclosure and is not intended for limiting the scope of the present disclosure in any manner.

FIG. 1 shows an example environment 100 where embodiments of the present disclosure can be implemented. As shown, a transmitter (TX) 110 is coupled to a receiver (RX) 130 along a transmission link 120. The transmitter 110 includes circuits operable to process and transmit digital signals along the transmission link 120. In particular, the transmitter 110 includes a line driver circuit 112 to produce signals that match the data rate required by the transmission lines. The receiver 130 also includes circuits operable to receive and process digital signals from the transmission link 120. The transmission link 120 may include a variety of media, including but not limited to cables such as universal serial bus (USB) cables and high-definition multimedia interface (HDMI) cables, traces on a printed circuit board (PCB), package bonding wires, and electro-static discharge (ESD) connections.

In the environment 100, the transmitter 110 and the receiver 130 are configured to transmit and receive differential signals along two transmission lines 120. The differential signals may include two signals that are out of phase and equal in amplitude. For ease of discussion, the following embodiments and implementations are primarily described in terms of differential signaling. Those skilled in the art will recognize that the various embodiments may be used for either differential or single-ended signaling.

Signals transmitted by the transmitter 110 and traveling along the transmission lines 120 may suffer from signal attenuation, dispersion, or other signal deterioration occurring during transmission and propagation, which may introduce undesirable inter-symbol interference (ISI). To reduce the ISI, conventionally techniques such as feed-through capacitance (FTC, also called as capacitive peaking technique) may be applied in the line driver 112.

Figure 2:
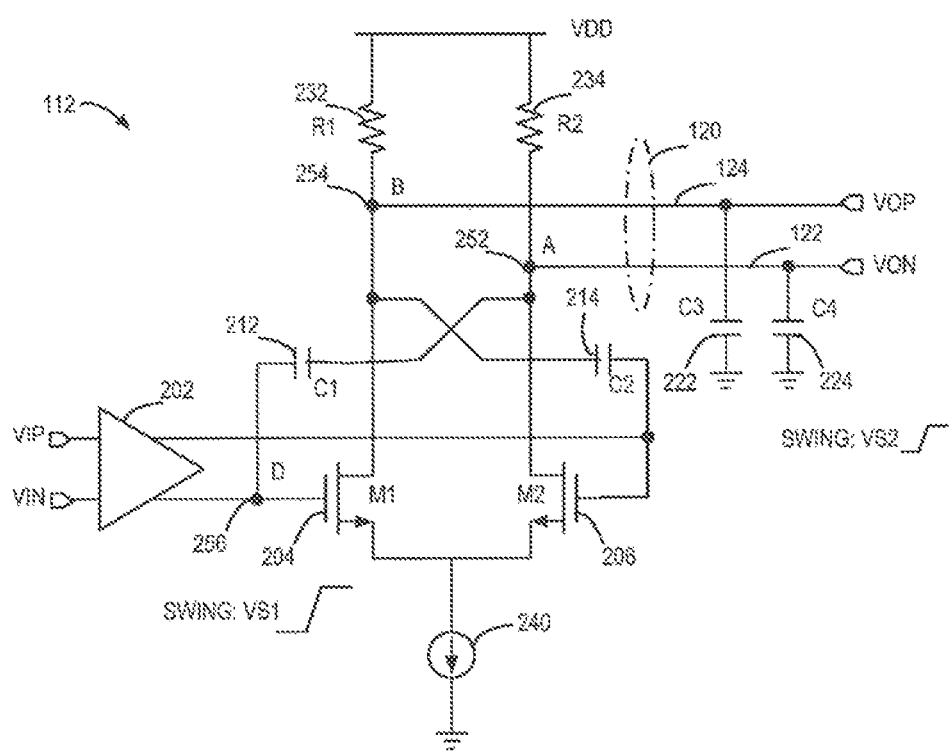
FIG. 2 is a block diagram of a conventional line driver with feed-through capacitance.

FIG. 2 shows a conventional line driver circuit 112 with a configuration of feed-through capacitance. As shown, the line driver 112 includes a pre-driver 202 to produce drive signals for a differential pair of transistors M1 204 and M2 206 in response to a pair of input differential signals Vip and Vin. The line driver 112 also includes two loading resistors R1 232 and R2 234 connected to the power supply Vdd, and a tail current source 240. The drive signals may be used to drive the differential pair of transistors 204 and 206 to generate output differential signals Vop and Von for transmission on the transmission link 120 which includes two lines 122 and 124. The transmission lines 122 and 124 are coupled with the line driver 112 at output nodes A 252 and B 254.

As shown in FIG. 2, a pair of capacitors C1 212 and C2 214 are driven by the drive signals of the pre-driver 202, used as feed-through capacitors to reduce loading parasitic capacitance at the output nodes 252 and 254. The loading parasitic capacitance may be caused by the coupling of the line driver 112 with the transmission lines 122 and 124. For illustration, the parasitic capacitance on the respective transmission lines 122 and 124 is depicted as respective capacitors C3 222 and C4 224. The principle of ISI reduction by feed-through capacitance is described briefly below.

It is assumed that the voltage swing (denoted as "Vs2") of the parasitic capacitor 224 is 500 mV and the voltage swing (denoted as "Vs1") of the feed-through capacitor 212 is 1000 mV (which may be related to the voltage change of the power supply). The charge transferring of the node 252 may be represented as follows:

$$\text{Transferred Charge} = V_{s2}*C4 + (-V_{s1}+V_{s2})*C1 = V_{s2}*C_{eq} \quad (1)$$

where Ceq represents the equivalent loading capacitance of the whole driver 112. Based on Equation (1), the equivalent loading capacitance Ceq may be written as follows:

$$C_{eq} = C4 + (1-V_{s1}/V_{s2})*C1 = C4 + C1 - V_{s1}/V_{s2}*C1 \quad (2)$$

If the voltage swing Vs1 is 1000 mV and the voltage swing Vs2 is 500 mV, Ceq may be calculated as being equal to C4−C1. If C4 is equal to C1, the equivalent loading capacitance Ceq is zero. It can be seen from Equation (2) that the feed-through capacitor 212 acts as a negative capacitor which reduces the parasitic capacitance 224. The feed-through capacitor 214 works in a similar manner to reduce parasitic capacitance 222. Thus, the feed-through capacitance technique may also be called as the negative-C technique.

As the equivalent loading capacitance Ceq in Equation (2) is reduced, the rising/falling time of the output signals is reduced, which therefore reduces the inter-symbol interference and improves the eye-diagram openness. In order to guarantee that the feed-through capacitance works, Vs1 are required to be larger than Vs2 at the node 252.

The principle of the ISI reduction by the feed-through capacitance has been described above. According to the above principle, the higher ratio the voltage swing of Vs1 to Vs2 is, the better the feed-through capacitance works. However, in high data rate cases, there are several difficulties in getting a higher voltage swing ratio as discussed below.

First, the line driver 112 with a higher data rate requires a more advanced process, which leads to a lower power supply Vdd. Since the pre-driver 202 for the feed-through capacitors 212 and 214 is usually a complementary metal oxide semiconductor (CMOS) inverter, the voltage swing of Vs1 becomes smaller.

Moreover, as the data rate becomes higher, it might be harder to the pre-driver 202 to drive the feed-through capacitors 212 and 214. If the feed-through capacitors 212 and 214 cannot be driven to the level to reduce the parasitic capacitance in an appropriate speed, it may be possible that serious ISI may already happen when the capacitors 212 and 214 works appropriately.

In addition, the higher the data rate is, the larger the insertion loss of the package, PCB traces, ESD diodes is, which leads to a higher voltage swing Vs2 at the output nodes 252 and 254. For example, a HDMI cable requires the voltage swing of a test point to be within a range from 400 mV to 600 mV. If the insertion loss from a pad for the line driver to the test point is 6 dB, it means that the voltage swing at the pad (which is equivalent to the voltage swing Vs2 at the output node) needs to be in a range from 800 mV to 1.2 V. That is, the voltage swing Vs2 is increased.

Figure 3:
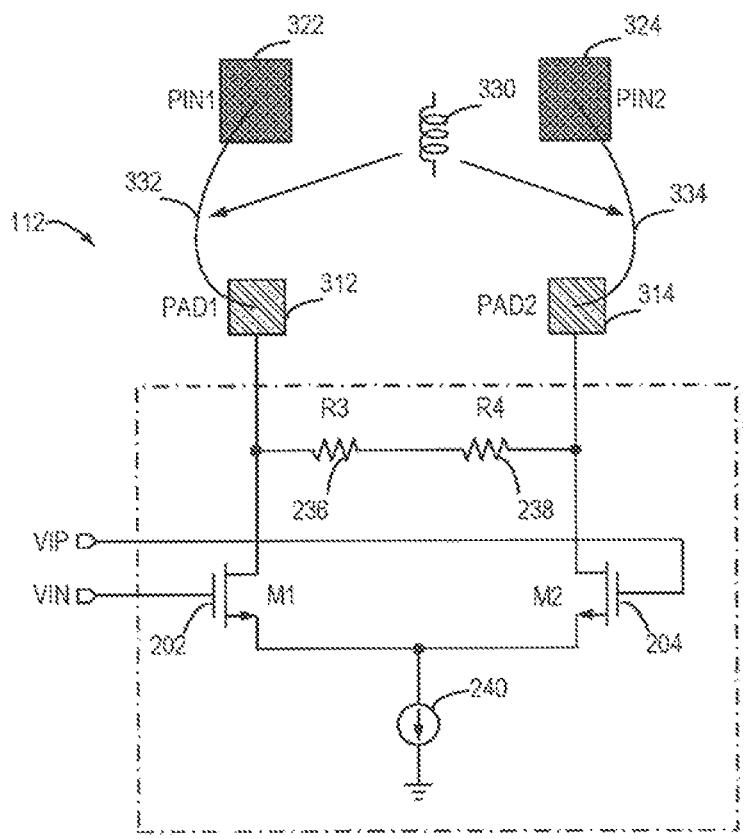
FIG. 3 is a block diagram showing possible overshot introduced by bonding wire inductors in a conventional line driver.

Further, the feed-through capacitance works only at the rising/falling edges of the output signals, while the bonding wire inductors of a line driver may also introduce overshot at the same moment, which increases the voltage swing at a pad Vs2. FIG. 3 shows such a conventional line driver 112 which also includes a differential pair of transistors M1 202 and M2 204 and a tail current source 240.

The pre-driver 202 of the line driver 112 is omitted in FIG. 3 and thus the transistors 302 and 304 are driven by a pair of input differential signals Vip and Vin and coupled with the tail current source 240. The resistors R3 236 and R4 238 are the terminal resistors for the output impedance matching. The output nodes of the line driver 112 of FIG. 3 are connected to two pads Pad1 312 and Pad2 314 and then connected to pins Pin1 322 and Pin2 324 via bonding wires 332 and 334 which may be represented as respective inductors 330. The inductors 330 will introduce overshot at the rising/falling edges of the output signals.

Figure 4:
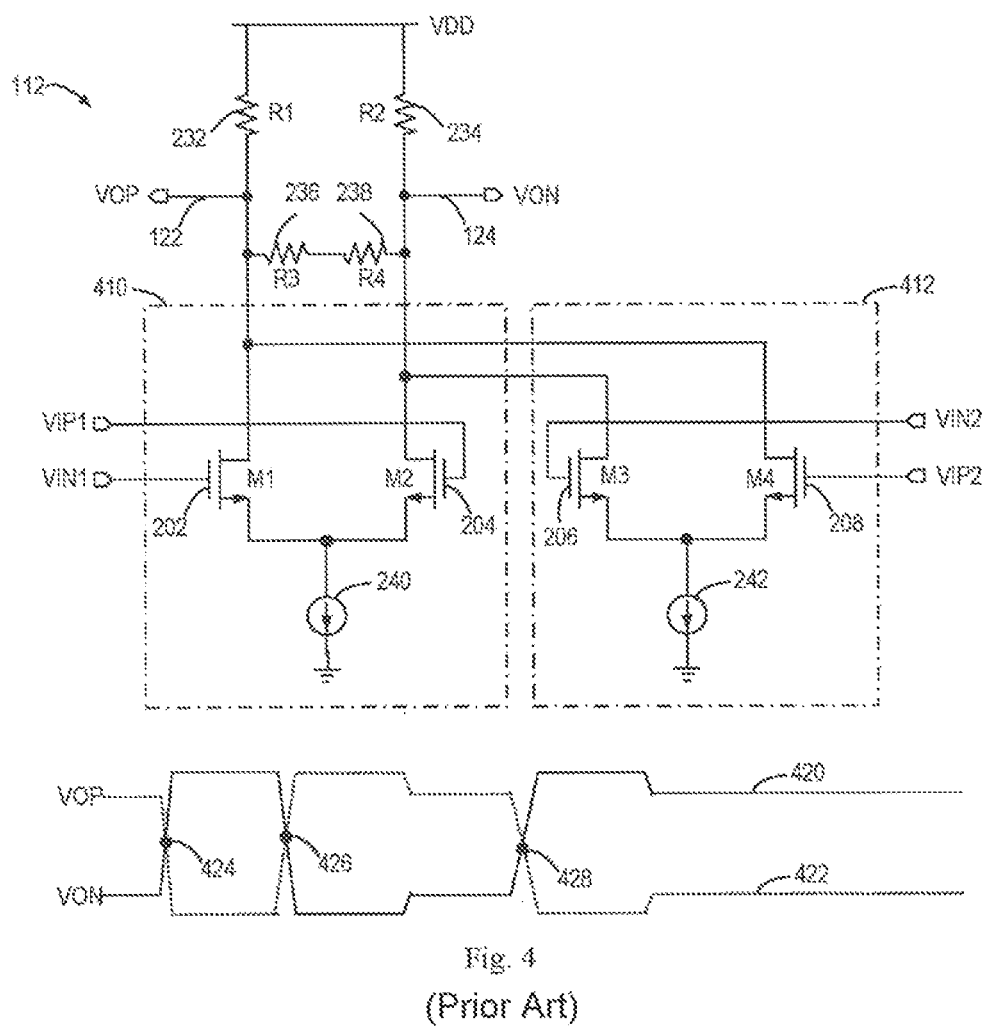
FIG. 4 is a block diagram of a conventional line driver with feed-forward equalization and a timing diagram of output signals.

Additionally, feed-forward equalization (FFE) is another technique that can be applied in line drivers to reduce inter-symbol interference. However, traditionally the feed-forward equalization is not used together with the feed-through capacitance because the same problem of overshot occurs when they are combined in a line driver. FIG. 4 shows a conventional line driver 112 with feed-forward equalization.

The line driver 112 of FIG. 4 includes in a main-cursor driver 410 and a post-cursor driver 412. The main-cursor driver 410 includes the differential pair of transistors 202 and 204 that are driven by the input differential signals (Vip1 and Vin1), and a main-cursor tail source current 240. The post-cursor driver 412 includes another differential pair of transistors M3 206 and M4 208 and a post-cursor tail source current 242. The transistors 206 and 208 of the post-cursor driver 412 are driven by input differential signals Vip2 and Vin2, which are delayed from the input differential signals Vip1 and Vin1 by, for example, one unit interval. After the delaying, the signs of the input differential signals Vip2 and Vin2 of the post-cursor driver 412 and the signs of the input differential signals Vip1 and Vin1 of the main-cursor driver 410 may be the same or opposite. In the following, only the cases of opposite signs are discussed, and those skilled in the art would appreciate the implementations where the signs are the same.

The post-cursor driver 412 is used to equalize the output signals of the main-cursor driver 410 so that inter-symbol interference in the output signals may be reduced. Generally the feed-forward equalization of the line driver 112 works at the rising/falling time of the output signals. For example, as shown in the timings 420 and 422 of the output signals Vop and Von, the equalization works at the points 424, 426, and 428. However, the feed-through capacitance also works at these moments. If both the feed-forward equalization and feed-through capacitance are applied in the line driver 112, the problem of overshot may occur, which is also not desirable.

In order to at least partially address the above problems and other potential problems, embodiments of the present disclosure propose a line driver circuit. The line driver of the present disclosure has combined feed-forward equalization and feed-through capacitance in a pre-driver for driving feed-through capacitors, which may significantly reduce the inter-symbol interference and may be suitable for use in the high data rate cases. In some other embodiments of the present disclosure, the line driver as a whole may employ both the feed-forward equalization and feed-through capacitance to further overcome the inter-symbol interference problem.

Figure 5:
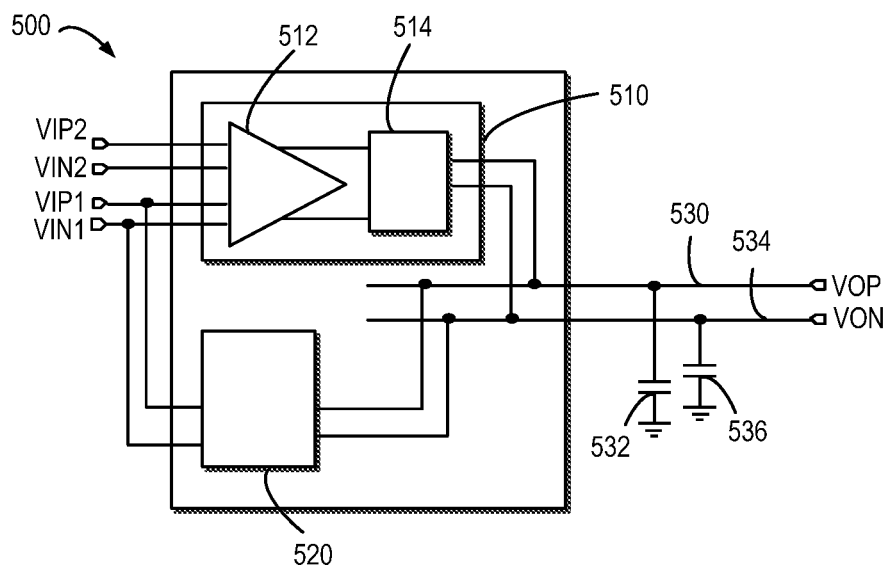
FIG. 5 is a block diagram of an apparatus in accordance with an embodiment of the present disclosure.

FIG. 5 shows a block diagram of an apparatus 500 in accordance with an embodiment of the present disclosure. The apparatus 500 may be used as the line driver circuit 112 in the transmitter 110 of FIG. 1. The apparatus 500 is configured to output differential signals Vop and Von on respective transmission lines 530 and 534 in response to input differential signals Vip1 and Vin1. The differential signals may include a first signal (for example, Vip1 or Vop) and an inverse second signal (for example, Vin1 or Von). The first signal and the inverse second signal may be out of phase but have the same amplitude, for example.

The apparatus 500 includes a driving module 520 with output terminals coupled to the transmission lines 530 and 534. The driving module 520 is operable to generate the output signals from the input differential signals Vip1 and Vin1. To reduce the inter-symbol interference, the apparatus 500 includes a capacitive feed-through module 510. The capacitive feed-through module 510 includes a pre-driver 512 (also referred to as a "first pre-driver") and a capacitance reducing module 514. The pre-driver 512 is operable to receive the input differential signals Vip1 and Vin1 and generate drive signals (also referred to as "first drive signals") from the input differential signals Vip1 and Vin1. The drive signals are used to drive the capacitance reducing module 514.

The pre-driver 512 is also operable to equalize the drive signals. The equalization of the pre-driver 512 may be feed-forward equalization (FFE). Thus, the pre-driver 512 also receives delayed signals Vip2 and Vin2 of the input differential signals Vip1 and Vin1 to generate and equalize the drive signals. The signals Vip2 and Vin2 are delayed from the signals Vip1 and Vin1 by, for example, one unit interval. In other examples, the signals Vip2 and Vin2 may be delayed by more than one unit interval. As mentioned above, the signs of the differential signals Vip2 and Vin2 and the signs of the differential signals Vip1 and Vin1 may be the same or opposite after delaying, but only the cases of opposite signs are discussed in embodiments of the present disclosure.

The pre-driver 512 may implement the feed-forward equalization in a variety of fashions. In some embodiments, the pre-driver 512 may be operable to amplify voltage levels of the drive signals within a transient time (for example, the rising/failing time) of the input differential signals Vip1 and Vin1, and reduce the voltage levels of the drive signals within a steady time of the input differential signals Vip1 and Vin1. By means of the feed-forward equalization in the pre-driver 512, it is possible to provide a large swing for the drive signals to drive the capacitance reducing module 514 so as to reduce the effect of the inter-symbol interference problem caused by the signal attenuation and dispersion during propagation through the transmission lines 530 and 534.

The capacitance reducing module 514 is arranged between the pre-driver 512 and the transmission lines 530 and 534 and operable to reduce parasitic capacitance (represented as capacitors 532 and 536 in FIG. 5) at the transmission lines 530 and 534 in response to the drive signals from the pre-driver 512. Due to the feed-forward equalization applied in the pre-driver 512, the capacitance reducing module 514 may have a large voltage swing to a level to reduce the parasitic capacitance in an appropriate speed even in high data rate cases. The reduction of the parasitic capacitance may result in decreasing the raising/ falling time of the output signals and reducing the inter-symbol interference as discussed above.

Figure 6:
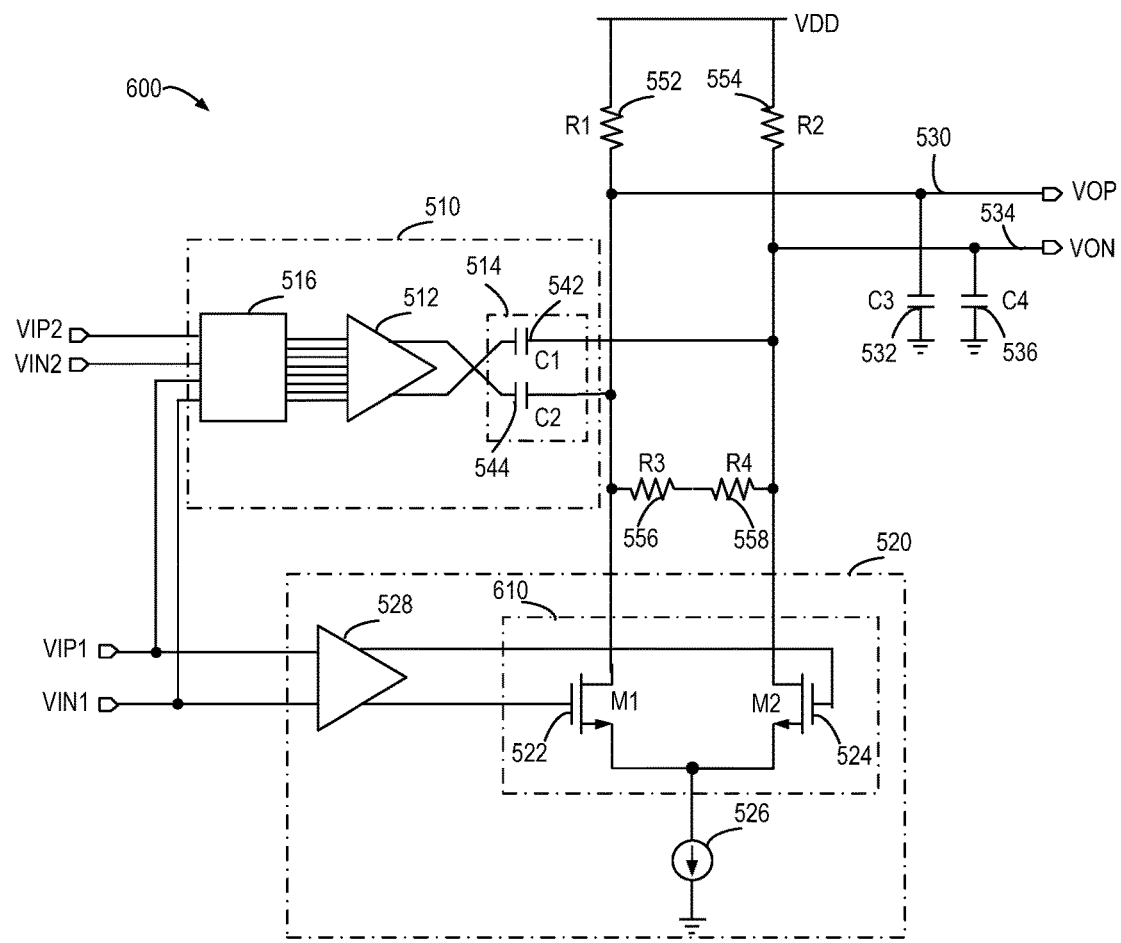
FIG. 6 is a block diagram of an example of the apparatus of FIG. 5 in accordance with an embodiment of the present disclosure.

FIG. 6 shows an example diagram of an apparatus 600 in accordance with an embodiment of the present disclosure. The apparatus 600 may be an example implementation of the apparatus 500. In this example, the driving module 520 includes a main-cursor driver 610 to generate the output differential signals Vop and Von in response to the input differential signals Vip1 and Vin1. The main-cursor driver 610 is implemented by a differential pair of transistors M1 522 and M2 524. The driving module 520 also includes a pre-driver 528 (also referred to as a "second pre-driver") to generate drive signals (also referred to as a "second drive signals") from the input differential signals Vip1 and Vin1 for driving the transistors 522 and 524. The pre-driver 528 may be a buffer in some embodiments or may be an inverter in some other embodiments. In some embodiments, the input differential signals Vip1 and Vin1 may be directly used as the drive signals for the transistors 522 and 524 and thus the pre-driver 528 may be omitted.

In the example of FIG. 6, the source terminal of the transistor 522 is coupled with the source terminal of the transistor 524 to a tail current source 526. The drain terminals of the transistors 522 and 524 are coupled to a power supply Vdd and also coupled to the respective transmission lines 530 and 534 to output the signals Vop and Von. The gate terminals of the transistors 522 and 524 are operable to receive the drive signals from the pre-driver 528. The drain terminals of the transistors 522 and 524 may provide the output signals Vop and Von that are generated in response to the received drive signals to the respective transmission lines 530 and 534.

Two loading resistors R1 552 and R2 554 may be coupled between the power supply Vdd and the outputs of the driving module 520. In some embodiments, terminal resistors R3 556 and R4 558 are connected in series between the outputs of the driving module 520 for output impedance matching, so as to avoid the transmitted output signals not being fully absorbed at the receiver and avoid excess energy being reflected back and forth in the transmission lines as noise.

In the capacitive feed-through module 510, the capacitance reducing module 514 is implemented by feed-through capacitors C1 542 and C2 544 each coupled to the respective transmission lines 530 and 534. The capacitors 542 and 544 include input terminals coupled to the outputs of the pre-driver 512 to receive the drive signals from the pre-driver 512. The capacitors 542 and 544 may be operable to reduce parasitic capacitance at the transmission lines 530 and 534 in response to the drive signals.

Generally, the voltage swing of the capacitors 542 and 544 depends on the power supply Vdd if no feed-forward equalization is provided. To further increase the voltage swing for the feed-through capacitors 542 and 544, a level shifter 516 is included in the capacitive feed-through module 510 to shift voltage levels of the input differential signals Vip1 and Vin1 and voltage levels of the delayed signals Vip2 and Vin2. For example, if the voltage range of the signals Vip1 and Vin2 is from 0 V to 1 V, the level shifter 516 may shift it to a range from 1 V to 2 V. The delayed signals Vip2 and Vin2 may be similarly shifted. The signals Vip1, Vin1, Vip2, and Vin2 are provided by the level shifter 516 to the pre-driver 512 as well as the corresponding shifted signals, to produce the drive signals by the pre-driver 512.

As mentioned above, the high speed data rate may require an advance process and thus result in a lower power supply. When the input signals are shifted to a high voltage range, there may be a trade-off between the high speed data rate and the power supply of the input signals. As will be discussed below, the pre-driver 512 may be implemented by transistors such as MOS transistors. In many high speed data rate cases, thick-oxide metal oxide semiconductor (MOS) transistors may not be used because they consume large power. Although thin-oxide MOS transistors may also support the high data rate, it may have voltage stresses. For example, the thin-oxide MOS transistors may lead to breakdown or much shorter lifetime if they work with higher power supply.

To deal with the trade-off and use thin oxide transistors with higher or even double/triple power supply when the level shifter 516 is applied, in some embodiments, the pre-driver 512 may be a pulsed cascode driver since it is suitable to deliver the swing of double power supply and to use thin-oxide transistors without voltage stress. Example implementations of the pre-driver 512 will be described below with reference to FIG. 8.

Although a separate pre-driver 528 is shown to produce drive signals for the differential pair of transistors 522 and 524, in some other embodiments, the drive signals from the pre-driver 512 may also be used to drive the transistors 522 and 524 and thus the pre-driver 528 may be omitted. It would also be appreciated that although the transistors 522 and 524 are shown as N-channel type MOS (NMOS) transistors in the example of FIG. 6, other types of transistors such as P-channel type MOS (PMOS) transistors or metal-oxide-semiconductor field effect transistors (MOSFET) may also be used.

In some embodiments, in order to produce output signals Vop and Von that can further count-act the inter-symbol interference in even high data rate cases, the driving module 520 may also be operable to equalize the output signals of the differential pair 610. This feed-forward equalization may not introduce the overshot problem for the inter-symbol interference reduction of the feed-through capacitance because the pre-driver 512 have increased the voltage swing of the feed-through capacitors and thus the inter-symbol interference may be mitigated to some extent.

Figure 7:
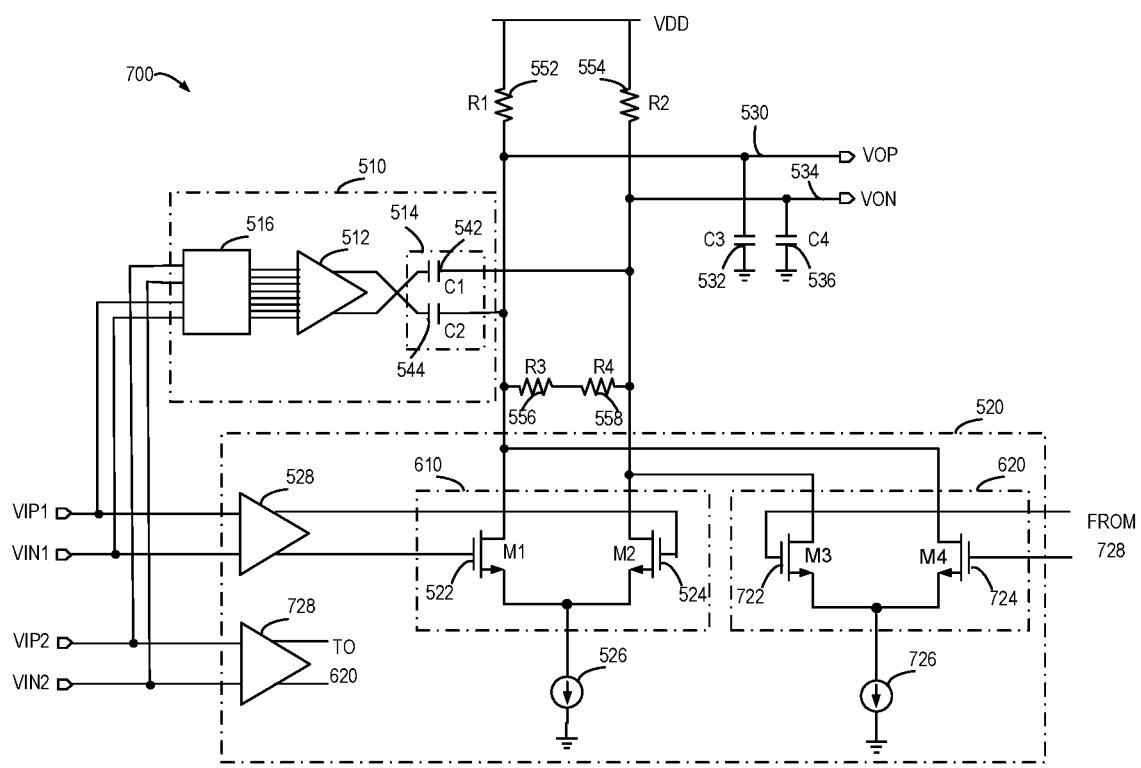
FIG. 7 is a block diagram of an example of the apparatus of FIG. 5 in accordance with another embodiment of the present disclosure.

FIG. 7 shows such an apparatus 700 with the feed-forward equalization in the driving module 520. The apparatus 700 may be another example implementation of the apparatus 500. It is noted that functions of the components with the same references are the same as those described with reference to FIG. 6 and thus are omitted here for brevity. In the example of FIG. 7, the driving module 520 further includes a post-cursor driver 620 to equalize the output signals of the main-cursor driver 610. In some example embodiments, the post-cursor driver 620 may amplify voltage levels of the output signals within a transient time (for example, the rising/failing time) of the input differential signals Vip1 and Vip2 and reduce the voltage levels of the output signals within a steady time of the input differential signals Vip1 and Vip2.

The post-cursor driver 620 may be implemented by a differential pair of transistors M3 722 and M4 724. The driving module 520 also includes a pre-driver 728 (also referred to as a "third pre-driver") to generate drive signals (also referred to as "third drive signals") from the delayed signals Vip2 and Vin2 for driving the transistors 722 and 724. The pre-driver 728 may be a buffer in some embodiments or may be an inverter in some other embodiments. In some embodiments, the input delayed signals Vip2 and Vin2 may be used as the drive signals for the transistors 722 and 724 and thus the pre-driver 728 may be omitted.

In the example of FIG. 7, the source terminal of the transistor 722 is coupled with the source terminal of the transistor 724 to a tail current source 726. For the purpose of feed-forward equalization, the current level provided by the source 726 may be lower than that provided by the source 526 of the main-cursor driver 610. The drain terminals of the transistors 722 and 724 are coupled to the respective drain terminals of the transistors 522 and 524 and to the power supply Vdd. The gate terminals of the transistors 522 and 524 are operable to receive the drive signals from the pre-driver 728 to implement the feed-forward equalization. The drain terminals of the transistors 722 and 724 may provide signals that are generated in response to the received drive signals to equalize the outputs of the transistors 522 and 524. It would be appreciated that the transistors 722 and 724 may also be implemented by other types of transistors such as P-channel type MOS (PMOS) transistors or metal-oxide semiconductor field effect transistors (MOSFET).

Figure 8:
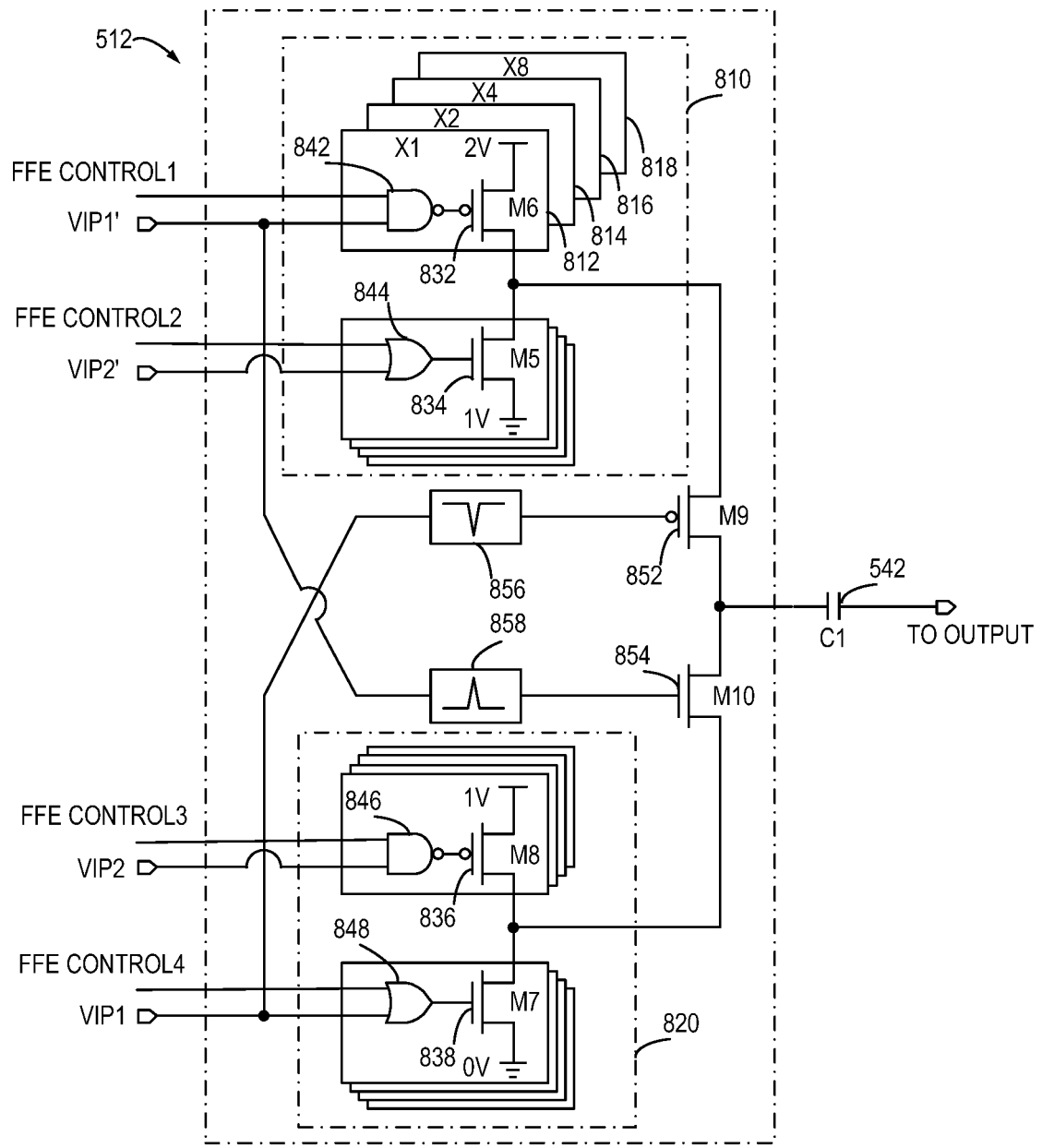
FIG. 8 is a block diagram of a half of a pre-driver in the apparatus of FIG. 5 in accordance with an embodiment of the present disclosure.

In some embodiments, the pre-driver 512 may be a voltage-mode pre-driver that is able to drive the feed-through capacitors and realize the feed-forward equalization at the same time. In one example, the voltage-mode pre-driver 512 may be implemented in a source series terminal (SST) structure with the output impedance being kept the same by using terminal resistance either of a PMOS branch or a NMOS branch. The pre-driver 512 may then provide equalization by changing the connection to either the PMOS branch terminal resistance or the other branch. FIG. 8 shows a half of such a pre-driver 512. In this example, only a single-end pulsed cascode pre-driver 512 is shown to produce one equalized drive signal. The other half of the pre-driver 512 may be similarly designed. The pre-driver 512 also receive corresponding FFE control signals for the equalization.

In the case where the level shifter 516 is included, the pre-driver 512 includes a signal generating module 810 including input terminals for receiving a shifted signal of the input differential signal Vip1 (denoted as Vip1') and a shifted signal of the corresponding delayed signal Vip2 (denoted as Vip2') and an output terminal for outputting an intermediate (drive) signal. The intermediate drive signal is generated in response to the received signals and is equalized in the module 810. The signal generating module 810 is implemented by a set of cascode transistors including a plurality pairs of transistors. Each pair includes a pull-up transistor M6 832 and a pull-down transistor M5 834. The pull-up and pull-down transistors 832 and 834 are implemented using respective PMOS and NMOS transistors. The drain terminal of a PMOS transistor 832 is coupled with the drain terminal of a NMOS transistor 834 to form an output terminal. The source terminal of the PMOS transistor 832 is connected to a high power level (for example, a power supply of 2V) while the source terminal of the NMOS transistor 834 is connected to a low power level (for example, a power supply of 1V). The transistors 832 and 834 may be driven in response to the input differential signal Vip1' and the delayed signal Vip2' at their gates.

To realize the equalization, the signal generating module 810 may include a plurality pairs of transistors 832 and 834. The operations of these pairs of transistors may be controlled by corresponding FFE control signals. As shown, the module 810 may include four layers of transistors 812, 814, 816, and 818 each including one, two, four, and eight pairs of transistors 832 and 834. Those layers are activated or deactivated by the corresponding FFE control signals. As shown, a FFE control signal and the input Vip2' may be input to a NAND logic gate 842 in the layer 812 and the output of the NAND gate 842 (which may be regarded as a drive signal) is provided to the gate terminal of the transistor 832. Another FFE control signal and the input Vip1' may be input to an OR logic gate 844 in the corresponding layer 812 and the output of the OR gate 844 (which may be regarded as a further drive signal) is provided to the gate terminal of the transistor 834.

Each of the FFE control signals may have a logically high value or a logically low value. In the example of the module 810, a FFE control signal with a logically high value indicates that the control signal has a power of 2V, while a FFE control signal with a logically low value indicates that the control signal has a power of 1V. By providing different FFE control signals to the layers, the output of the module 810 may be equalized to different levels. The FFE control signals may be configured based on the condition of the transmission lines 830 and 834.

In some example embodiments, the pre-driver 512 may further include another signal generating module 820 that includes input terminals for receiving the input differential signal Vip1 and the corresponding delayed signal Vip2 and an output terminal for outputting another intermediate (drive) signal. The intermediate drive signal may be generated in response to the received signals and is equalized in the module 820. The signal generating module 820 may be implemented by a set of cascode transistors including a plurality pairs of cascode transistors. Each pair of cascode transistors of the module 820 includes a pull-up transistor M8 836 and a pull-down transistor M7 838.

The arrangement of the pair of transistors 836 and 838 as well as the arrangement of different layers of transistor pairs in the module 820 may be in a similar way as that in the module 810. The high power level in the module 820 may be a power supply of 1V while the low power level in the module 820 may be the ground. By configuring FFE control signals, the output intermediate drive signal may be equalized to different levels. It is noted that in the module 820, a FFE control signal with a logically high value indicates that the control signal has a power of 1V, while a FFE control signal with a logically low value indicates that the control signal is grounded. The intermediate drive signals from the modules 810 and 820 may be combined by a combing module to produce the resulting drive signal for the feed-through capacitor 542. The combining module is implemented by a pair of cascode transistors M9 852 and M10 854.

In the example of FIG. 8, the pair of transistors 852 and 854 are implemented using respective PMOS and NMOS transistors. The source terminal of the PMOS transistor 852 is coupled to the output of the module 810 to receive the output intermediate drive signal while the source terminal of the NMOS transistor 854 is coupled to the output of the module 820 to receive the other output intermediate drive signal. The drain terminals of the transistors 852 and 854 are coupled together to form an output terminal to provide a drive signal for the capacitor 542.

Pulse generators 856 and 858 are connected to the respective gate terminals of the transistors 852 and 854 and are operable to generate a down pulse signal and an up pulse signal to drive the respective transistors 852 and 854. The pulse generator 856 is operable to receive the input differential signal Vip1 to produce the down pulse signal while the pulse generator 858 is operable to receive the shifted differential signal Vip1' to produce the corresponding up pulse signal. The use of the pulse generators is to guarantee that no voltage stress exists during the transitions of the pre-driver 512.

The other input differential signal Vin1, its delayed signal Vin2, and corresponding shifted signals (denoted as Vin1' and Vin2') may be input to the other part of the pre-driver 512 which include signal generating modules similar to the modules 810 and 820, to generate and equalize another drive signal for driving the feed-through capacitor 544. It would be appreciated that the example of FIG. 8 is only provided as an example. Many other pre-drivers with the function of feed-forward equalization, either currently known or to be developed in the future, may be used as the pre-driver 512. In some embodiments, if the level shifter 516 is not applied in the apparatus 600 or 700, the output of the module 820 may be provided as a drive signal for the feed-through capacitor C1 542 and thus the module 810, the pulse generators 856 and 858, and the pair of transistors 852 and 854 may be omitted.

Figure 9:
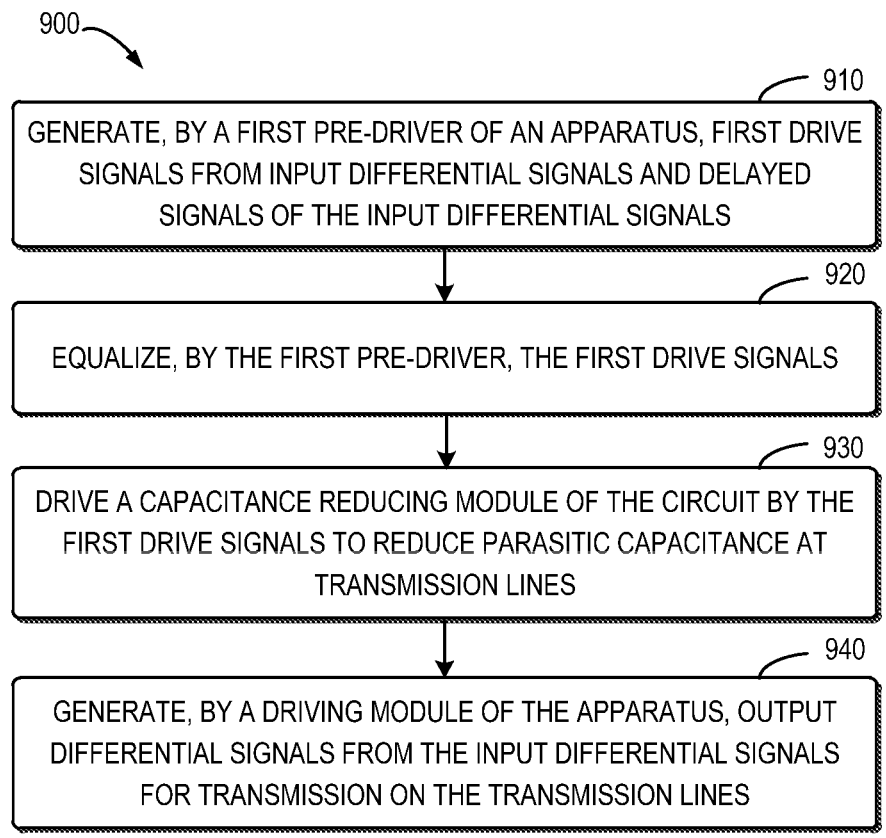
FIG. 9 is a flowchart of a method in accordance with an embodiment of the present disclosure.

FIG. 9 shows a flowchart of a method for a line driver apparatus in accordance with embodiments of the present disclosure, which may be implemented, for example, by the apparatus 500, 600, or 700. As shown, at 910, first drive signals are generated by a first pre-driver of an apparatus from input differential signals and delayed signals of the input differential signals. At 920, the first drive signals are equalized by the first pre-driver. At 930, a capacitance reducing module of the apparatus is driven by the first drive signals to reduce parasitic capacitance at transmission lines. The transmission lines are coupled to the capacitance reducing module. At 940, output differential signals are generated by a driving module of the apparatus from the input differential signals for transmission on the transmission lines.

In some example embodiments, the output differential signals may be equalized by the driving module.

In some example embodiments, when equalizing the output differential signals, second drive signals may be generated by a second pre-driver of the driving module from the input differential signals and third drive signals may be generated by a third pre-driver of the driving module from the delayed signals. The output differential signals may be generated by a main-cursor driver of the driving module in response to the second drive signals. The output differential signals may be equalized by a post-cursor driver of the driving module in response to the third drive signals.

In some example embodiments, when equalizing the first drive signals, voltage levels of the first drive signals may be amplified within a transient time of the input differential signals, and the voltage levels of the first drive signals may be reduced within a steady time of the input differential signals.

In some example embodiments, the input differential signals include a first signal and an inverse second signal, and the delayed signals include a first delayed signal of the first signal and a second delayed signal of the second signal. When generating the first drive signals, a first intermediate signal may be generated by a first signal generating module of the first pre-driver from the first signal and the first delayed signal as a first part of the first drive signals, and a second intermediate signal may be generated by a second signal generating module of the first pre-driver from the second signal and the second delayed signal as a second part of the first drive signals.

In some example embodiments, when equalizing the first drive signals, the first intermediate signal may be equalized by the first signal generating module, based on a first control signal, and the second intermediate signal may be equalized by the second signal generating module, based on a second control signal.

In some example embodiments, when generating the first drive signals, voltage levels of the input differential signals may be shifted by a level shifter of the apparatus to produce the shifted first and second signals, and voltage levels of the delayed signals may be shifted by a level shifter of the apparatus to produce the shifted first delayed and second signals. Then, a third intermediate signal may be generated by a third signal generating module of the first pre-driver from the shifted first signal and the shifted first delayed signal, and a fourth intermediate signal may be generated by a fourth signal generating module of the first pre-driver from the shifted second signal and the shifted second delayed signal. The first and third intermediate signals may be combined by a signal combining module of the first pre-driver to obtain the first part of the first drive signals and the second and fourth intermediate signals to obtain the second part of the first drive signals.

In some example embodiments, when equalizing the first drive signals, the third intermediate signal may be equalized by the third signal generating module based on a third control signal, and the fourth intermediate signal may be equalized by the fourth signal generating module based on a fourth control signal.

In some example embodiments, a pulse signal may be generated by a pulse generator of the first pre-driver for driving the signal combing module.

In some example embodiments, the delayed signals may be delayed by a unit interval of the input differential signals.

Generally speaking, various example embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

Additionally, various blocks shown in the flowcharts may be viewed as method steps, and/or as operations that result from operation of computer program code, and/or as a plurality of coupled logic circuit elements constructed to carry out the associated function(s). For example, example embodiments of the present disclosure include a computer program product including a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. In some implementations, a machine readable medium is a non-transitory medium, meaning that such medium does not include propagating signals. The machine readable medium may be a machine readable signal medium or a machine readable storage medium. A machine readable medium provide for data storage using any one or more of an electronic, magnetic, optical, electromagnetic, memristor, phase change, technologies. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction. When addressing some particular feature or implementation of a feature within such portion(s), it may be appropriate to identify substituent functions or otherwise characterize some sub-portion of that portion of the design in more detail, while abstracting other sub-portions or other functions.

Functional modules or units may be composed of circuitry, where such circuitry may be fixed function, configurable under program control or under other configuration information, or some combination thereof. Functional modules themselves may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units or modules, may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one embodiment" and "an embodiment" are to be read as "at least one embodiment." The term "another embodiment" is to be read as "at least one other embodiment". Other definitions, either explicit or implicit, may be included.

While operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure or of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination.

Various modifications, adaptations to the foregoing example embodiments of the present disclosure may become apparent to those skilled in the relevant arts in view of the foregoing description, when read in conjunction with the accompanying drawings. Any and all modifications will still fall within the scope of the non-limiting and example embodiments of the present disclosure. Furthermore, other embodiments of the present disclosure will come to mind to one skilled in the art to which those embodiments pertain having the benefit of the teachings presented in the foregoing descriptions and the drawings.

It will be appreciated that the embodiments of the present disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. An apparatus comprising:
    a capacitive feed-through module including
        a first pre-driver operable to receive input differential signals and delayed signals of the input differential signals, generate first drive signals from the input differential signals and the delayed signals, and equalize the first drive signals, wherein the first pre-driver comprises:
            a first transistor; and
            a first pulse generator configured to receive one of the input differential signals and generate a first pulse signal to drive the first transistor, and
        a capacitance reducing module arranged between the first pre-driver and transmission lines and operable to reduce parasitic capacitance at the transmission lines in response to the first drive signals, wherein the capacitance reducing module is connected to the first transistor; and
    a driving module coupled to the transmission lines and operable to generate output differential signals from the input differential signals for transmission on the transmission lines.

2. The apparatus of claim 1, wherein the driving module is further operable to equalize the output differential signals, wherein the driving module comprises:
    a second pre-driver operable to generate second drive signals from the input differential signals;
    a third pre-driver operable to generate third drive signals from the delayed signals;
    a main-cursor driver coupled to the second pre-driver and operable to generate the output differential signals in response to the second drive signals; and
    a post-cursor driver coupled to the third pre-driver and operable to equalize the output differential signals in response to the third drive signals.

3. The apparatus of claim 1, wherein the first pre-driver is further operable to equalize the first drive signals by:

amplifying voltage levels of the first drive signals within a transient time of the input differential signals; and
reducing the voltage levels of the first drive signals within a steady time of the input differential signals.

4. The apparatus of claim 1, wherein the input differential signals include a first signal and an inverse second signal, the delayed signals include a first delayed signal of the first signal and a second delayed signal of the second signal, and the first pre-driver further comprises:
  a first signal generating module operable to generate a first intermediate signal from the first signal and the first delayed signal as a first part of the first drive signals, and to equalize the first intermediate signal based on a first control signal; and
  a second signal generating module operable to generate a second intermediate signal from the second signal and the second delayed signal as a second part of the first drive signals, and to equalize the second intermediate signal based on a second control signal.

5. The apparatus of claim 4, wherein the capacitive feed-through module further includes:
  a level shifter coupled to the first pre-driver and operable to shift voltage levels of the input differential signals to produce a shifted first signal and a shifted second signal and to shift voltage levels of the delayed signals to produce a shifted first delayed signal and a shifted second delayed signal; and
  wherein the first pre-driver further includes:
    a third signal generating module operable to generate a third intermediate signal from the shifted first signal and the shifted first delayed signal and to equalize the third intermediate signal based on a third control signal,
    a fourth signal generating module operable to generate a fourth intermediate signal from the shifted second signal and the shifted second delayed signal and to equalize the fourth intermediate signal based on a fourth control signal, and
    a signal combining module operable to combine the first intermediate signal and the third intermediate signal and to combine the second intermediate signal and the fourth intermediate signal to obtain the first drive signals.

6. The apparatus of claim 5, wherein the signal combining module comprises the first transistor.

7. The apparatus of claim 1, wherein the delayed signals are delayed by a unit interval of the input differential signals.

8. The apparatus of claim 1, wherein the first pre-driver further comprises:
  a second transistor; and
  a second pulse generator configured to generate a second pulse signal to drive the second transistor, wherein the second transistor is connected to the first transistor and the capacitance reducing module.

9. A method comprising:
  generating, by a first pre-driver of an apparatus, first drive signals from input differential signals and delayed signals of the input differential signals, wherein the input differential signals include a first signal and an inverse second signal, wherein the delayed signals include a first delayed signal of the first signal and a second delayed signal of the second signal;
  equalizing, by the first pre-driver, the first drive signals;
  driving a capacitance reducing module of the apparatus by the first drive signals to reduce parasitic capacitance at transmission lines, the transmission lines being coupled to the capacitance reducing module; and
  generating, by a driving module of the apparatus, output differential signals from the input differential signals for transmission on the transmission lines,
  wherein the generating the first drive signals comprises:
    generating, by a first signal generating module of the first pre-driver, a first intermediate signal from the first signal and the first delayed signal as a first part of the first drive signals;
    generating, by a second signal generating module of the first pre-driver, a second intermediate signal from the second signal and the second delayed signal as a second part of the first drive signals;
    shifting, by a level shifter of the apparatus, voltage levels of the input differential signals to produce a shifted first signal and a shifted second signal and voltage levels of the delayed signals to produce a shifted first delayed signal and a shifted second delayed signal;
    generating, by a third signal generating module of the first pre-driver, a third intermediate signal from the shifted first signal and the shifted first delayed signal;
    generating, by a fourth signal generating module of the first pre-driver, a fourth intermediate signal from the shifted second signal and the shifted second delayed signal; and
    combining, by a signal combining module of the first pre-driver, the first intermediate signal and the third intermediate signal to obtain the first part of the first drive signals and the second intermediate signal and the fourth intermediate signal-to obtain the second part of the first drive signals.

10. The method of claim 9, further comprising: equalizing, by the driving module, the output differential signals.

11. The method of claim 10, wherein equalizing the output differential signals comprises:
  generating, by a second pre-driver of the driving module, second drive signals from the input differential signals;
  generating, by a third pre-driver of the driving module, third drive signals from the delayed signals;
  generating, by a main-cursor driver of the driving module, the output differential signals in response to the second drive signals; and
  equalizing, by a post-cursor driver of the driving module, the output differential signals in response to the third drive signals.

12. The method of claim 9, wherein equalizing the first drive signals comprises:
  amplifying voltage levels of the first drive signals within a transient time of the input differential signals; and
  reducing the voltage levels of the first drive signals within a steady time of the input differential signals.

13. The method of claim 9, wherein equalizing the first drive signals comprises:
  equalizing, by the first signal generating module, the first intermediate signal based on a first control signal; and
  equalizing, by the second signal generating module, the second intermediate signal based on a second control signal,
  wherein the delayed signals are delayed by a unit interval of the input differential signals.

14. The method of claim 9, wherein equalizing the first drive signals comprises:
  equalizing, by the third signal generating module, the third intermediate signal based on a third control signal; and equalizing, by the fourth signal generating module, the fourth intermediate signal based on a fourth control signal.

15. The method of claim 9, further comprising:
generating, by a pulse generator of the first pre-driver, a pulse signal for driving the signal combining module.

16. An apparatus comprising:
a first set of cascode transistors including
  gate terminals for receiving an input differential signal and a delayed signal of the input differential signal, and
  an output terminal for outputting a first drive signal that is generated in response to the received input differential signal and the delayed signal and is equalized;
a second set of cascode transistors including
  gate terminals for receiving an inverse signal of the input differential signal and an inverse delayed signal of the input differential signal, and
  an output terminal for outputting a second drive signal that is generated in response to the received inverse signal and the inverse delayed signal and is equalized;
a set of capacitors coupled to transmission lines and including input terminals coupled to the output terminals of the first and second sets of cascode transistors, the set of capacitors being operable to reduce parasitic capacitance at the transmission lines;
a first differential pair of transistors including
  gate terminals for receiving third drive signals that are generated from the input differential signal and the inverse signal, and
  drain terminals coupled to the transmission lines and for outputting output differential signals that are generated in response to the received third drive signals; and
a second differential pair of transistors including
  gate terminals for receiving fourth drive signals that are generated from a first delayed signal of the input differential signal and a second delayed signal of the inverse signal, and
  drain terminals coupled to the drain terminals of the first differential pair of transistors and for equalizing the output differential signals in response to the received fourth drive signals.

* * * * *